US008994427B2

(12) United States Patent
Qin et al.

(10) Patent No.: US 8,994,427 B2
(45) Date of Patent: Mar. 31, 2015

(54) METHOD AND APPARATUS FOR DUTY CYCLE DISTORTION COMPENSATION

(71) Applicant: Oracle International Corporation, Redwood City, CA (US)

(72) Inventors: Zuxu Qin, Palo Alto, CA (US); Dawei Huang, San Diego, CA (US); Deqiang Song, San Diego, CA (US); Jianghui Su, San Jose, CA (US); Baoqing Huang, San Diego, CA (US); Yan Yan, San Jose, CA (US)

(73) Assignee: Oracle International Corporation, Redwood Shores, CA (US)

( * ) Notice: Subject to any disclaimer, the term of this patent is extended or adjusted under 35 U.S.C. 154(b) by 0 days.

(21) Appl. No.: 13/937,424

(22) Filed: Jul. 9, 2013

(65) Prior Publication Data
US 2015/0015315 A1    Jan. 15, 2015

(51) Int. Cl.
*H03K 7/08* (2006.01)
(52) U.S. Cl.
CPC ........................................ *H03K 7/08* (2013.01)
USPC .......................................................... 327/175
(58) Field of Classification Search
USPC ................................................. 327/175, 176
See application file for complete search history.

(56) References Cited

U.S. PATENT DOCUMENTS

| 7,956,660 | B2 * | 6/2011 | Ooshima et al. ............... 327/175 |
| 8,704,572 | B2 | 4/2014 | Kerr et al. |
| 8,723,572 | B1 | 5/2014 | Ding et al. |
| 8,779,819 | B1 | 7/2014 | Venditti |

* cited by examiner

*Primary Examiner* — Hai L Nguyen
(74) *Attorney, Agent, or Firm* — Meyertons Hood Kivlin Kowert & Goetzel; Erik A. Heter

(57) ABSTRACT

A method and apparatus for duty cycle distortion compensation is disclosed. In one embodiment, an integrated circuit includes a differential signal transmitter having a main data path and a compensation data path. The main data path includes a first and second differential driver circuits each having output terminals coupled to a differential output. A transmission controller is configured to transmit data into the main and compensation data paths, the data corresponding to pairs of sequentially transmitted bits including an odd data bit followed by an even data bit, and further configured to determine respective duty cycle widths for each of the odd and even data bits as received by the transmission controller. The transmission controller is configured to cause the first and second driver circuits to equalize the respective duty cycle widths of the odd and even data bits, as transmitted, based their respective duty cycle widths as received.

17 Claims, 4 Drawing Sheets

METHOD AND APPARATUS FOR DUTY CYCLE DISTORTION COMPENSATION

BACKGROUND

1. Technical Field

This disclosure is directed to electronic systems, and more particularly, to the integrity of signals transmitted using high-speed digital signaling techniques.

2. Description of the Related Art

Jitter is a common affect that occurs in electronic systems, including in systems that transmit digital signals at rates. Jitter may be defined as an undesired deviation from the true periodicity of a periodic signal. For example, if a clock signal is intended to have a 50% duty cycle, jitter may cause the duty cycle to deviate to, e.g., 40%. This deviation can cause undesirable effects. For example, jitter in a clock signal can adversely affect the available setup and hold time for a signal transmitted to a receiver, in turn leading to the erroneous reading of data values (and effectively, the loss of data). Jitter can also cause other undesired affects, such as electromagnetic interference (EMI) and crosstalk.

Various techniques may be employed for reducing jitter. For example, filters may be used to minimize effects of sampling jitter. Jitter buffers and various types of anti jitter circuits may also be implemented in an electronic circuit to reduce jitter.

SUMMARY OF THE DISCLOSURE

A method and apparatus for duty cycle distortion compensation is disclosed. In one embodiment, an integrated circuit includes a differential signal transmitter having a main data path and a compensation data path. The main data path includes a first differential driver circuit having output terminals coupled to a differential output. The compensation data path includes a second differential driver circuit having output terminals coupled to the differential output. The integrated circuit also includes a transmission controller configured to transmit data into the main and compensation data paths, the data corresponding to pairs of sequentially transmitted bits including an odd data bit followed by an even data bit. The transmission controller is further configured to determine respective duty cycle widths for each of the odd and even data bits as received, and further configured to cause the first and second driver circuits to equalize the respective duty cycle widths of the odd and even data bits, as transmitted, based on the determination.

In one embodiment, a method includes receiving data to be transmitted as differential data over a communications link, wherein the differential data is serially transmitted in pairs of bits including a first bit followed by a second bit. The method further includes determining respective duty cycle widths for each of the first and second bits. Third and fourth bits are transmitted into main and compensation paths, respectively, wherein the third and fourth bits corresponding to the first bit. The fourth bit is transmitted as a complement of the third bit if the duty cycle width of the first bit is greater than the duty cycle width of the second bit. The method further includes transmitting fifth and sixth bits into the main and compensation paths, respectively, the fifth and sixth bits corresponding to the second bit, wherein sixth bit is transmitted as a complement of the fifth bit if the duty cycle width of the second bit is greater than the duty cycle width of the first bit.

BRIEF DESCRIPTION OF THE DRAWINGS

Other aspects of the disclosure will become apparent upon reading the following detailed description and upon reference to the accompanying drawings, which are briefly described as follows.

Figure 1:
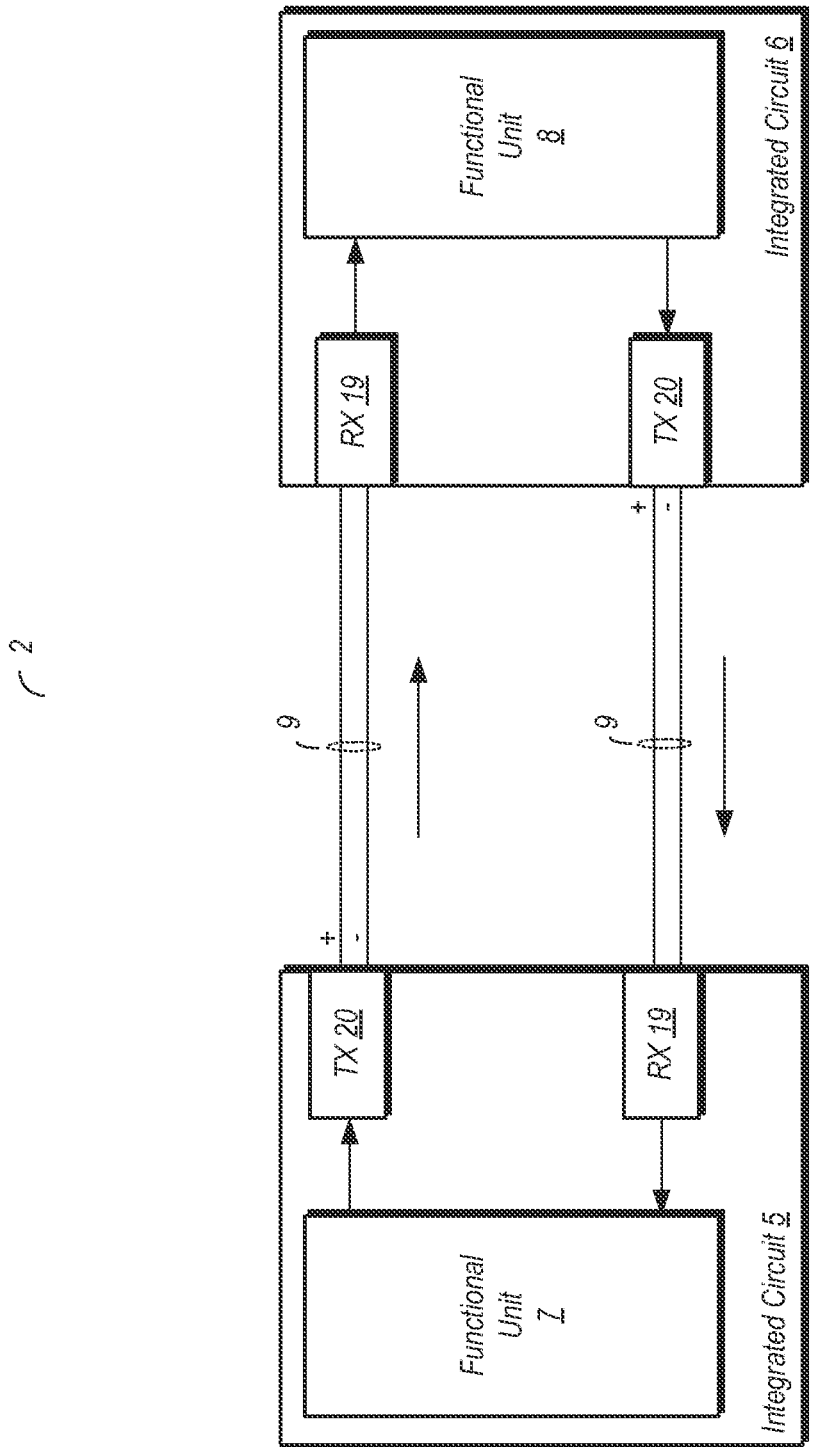
FIG. 1 is a block diagram of one embodiment of a system including multiple integrated circuits configured to communicate with each other over differential signal paths.

While the subject matter disclosed herein is susceptible to various modifications and alternative forms, specific embodiments thereof are shown by way of example in the drawings and will herein be described in detail. It should be understood, however, that the drawings and description thereto are not intended to be limiting to the particular form disclosed, but, on the contrary, is to cover all modifications, equivalents, and alternatives falling within the spirit and scope of the present disclosure as defined by the appended claims.

DETAILED DESCRIPTION

Turning now to FIG. 1, a block diagram of one embodiment of a system including multiple integrated circuits configured to communicate with each other over differential signal paths is shown. It is noted that the system shown in FIG. 1 is exemplary and is not intended to be limiting in any way. Furthermore, although the transmitters and receivers shown in FIG. 1 are arranged for transmission of signals from one integrated circuit (IC) to another, the disclosure is not intended to be limited in this manner. In contrast, the various embodiments described herein may be applied to any transmitter/receiver combination, including those residing within the same IC.

In the embodiment shown, system 2 includes a first IC 5 coupled to a second IC 5 by two different differential signal links 9. Transmitter 20 of IC 5 is configured to transmit information over a first differential signal link 9 to a receiver 19 in IC 6. Similarly, IC 6 includes a transmitter 20 configured to transmit information over a second differential signal link 9 to a receiver 19 in IC 5.

A functional unit 7 in IC 5 is coupled to provide digital data to its corresponding transmitter 20, and may also receive data from its corresponding receiver 19. Similarly, IC 6 includes a functional unit 8 coupled to convey data to the corresponding transmitter 20 and further coupled to receive data from the corresponding receiver 19. In one embodiment, the digital data may be provided from functional unit 7 to transmitter 20 in parallel, where it is subsequently serialized. In other embodiments, the data may be transmitted serially from functional unit 7 to transmitter 20. On the receive side, receiver 19 may in some embodiments de-serialize received data before transmitting it in parallel to functional unit 7. In other embodiments, receiver 19 may serially convey data to functional unit 7. The transmission of data between functional unit 8, transmitter 20 and receiver 19 in IC 6 may be carried out in the same manner as in IC 5 in some embodiments, although this is not a requirement for all embodiments.

As noted above, data is transmitted from each of the transmitters 20 serially. In some embodiments, data may be transmitted form a transmitter 20 in pairs of bits including a first bit followed by a second bit, in accordance with a four-phase clock. The first bit may be referred to as odd data, while the second bit may be referred to as even data. The four-phase clock may effectively be two clock signals with an intended separation of 90°, thereby resulting in clock transitions at 0°, 90°, 180°, and 270°. However, it is possible that, due to various conditions within an IC, the alignment of the clocks may not be as desired, thereby resulting in duty cycle distortion. When the clocks are not aligned, the width (or duty cycle width) of one of the odd and even bits may be wider than the other, in terms of time. The bit having the greater width may also have greater amplitude. Ideally, the odd and even bits will have the substantially the same width and substantially the same amplitude, as viewed in an eye diagram. When duty cycle distortion causes a significant difference in the respective widths and amplitudes of the odd and even bits, it is possible that the data can be misread at the receiver side.

Figure 2:
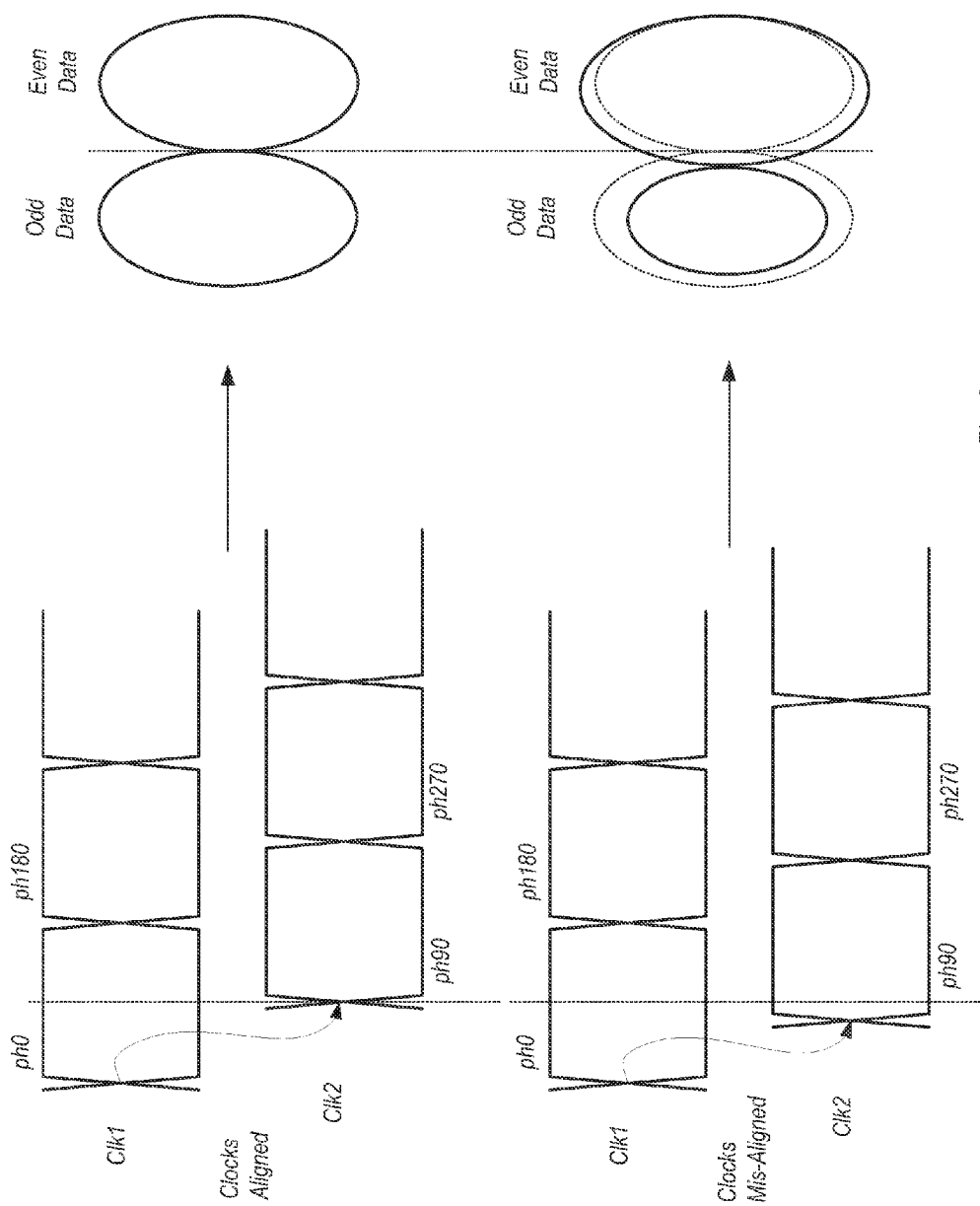
FIG. 2 is a diagram illustrating duty cycle distortion that may affect data transmissions in one embodiment of a system.

FIG. 2 illustrates the problem of duty cycle distortion as it may affect the embodiment of system 2 shown above (as well as similarly arranged systems). In the illustration, two examples of a four-phase clock are shown, along with exemplary eye diagrams illustrating the resulting odd and even data. In the upper example, the two signals comprising the four-phase clock are correctly aligned, with the Clk2 trailing Clk1 by 90°. Clock transitions thus occur at 0°, 90°, 180°, and 270° before the cycle repeats. The corresponding odd and even data bits, as illustrated by the eye diagrams to the right. In the case of the properly aligned clock signals, the eye diagrams show the odd and even data bits having approximately equal amplitudes and equal widths, in terms of time. Thus, the odd and even data in this case is not affected by duty cycle distortion.

In the second example, the clocks are not properly aligned. Clk2 transitions prior to the 90° phase mark. As a result of the early transition of Clk2, duty cycle distortion affects the amplitude and width of both the odd and even data, as shown by their respective eye diagrams. In this case, the amplitude and width of the odd data is reduced by the duty cycle distortion. Correspondingly, the even data has both an increased amplitude and increased width. Generally speaking, duty cycle distortion can cause the amplitude of one of the bits of odd and even data to be larger in amplitude and width than the other, depending on how the clocks are misaligned. Such mismatches between the respective amplitudes and widths of the odd and even data can cause data to be misread at the receiver end.

Figure 3:
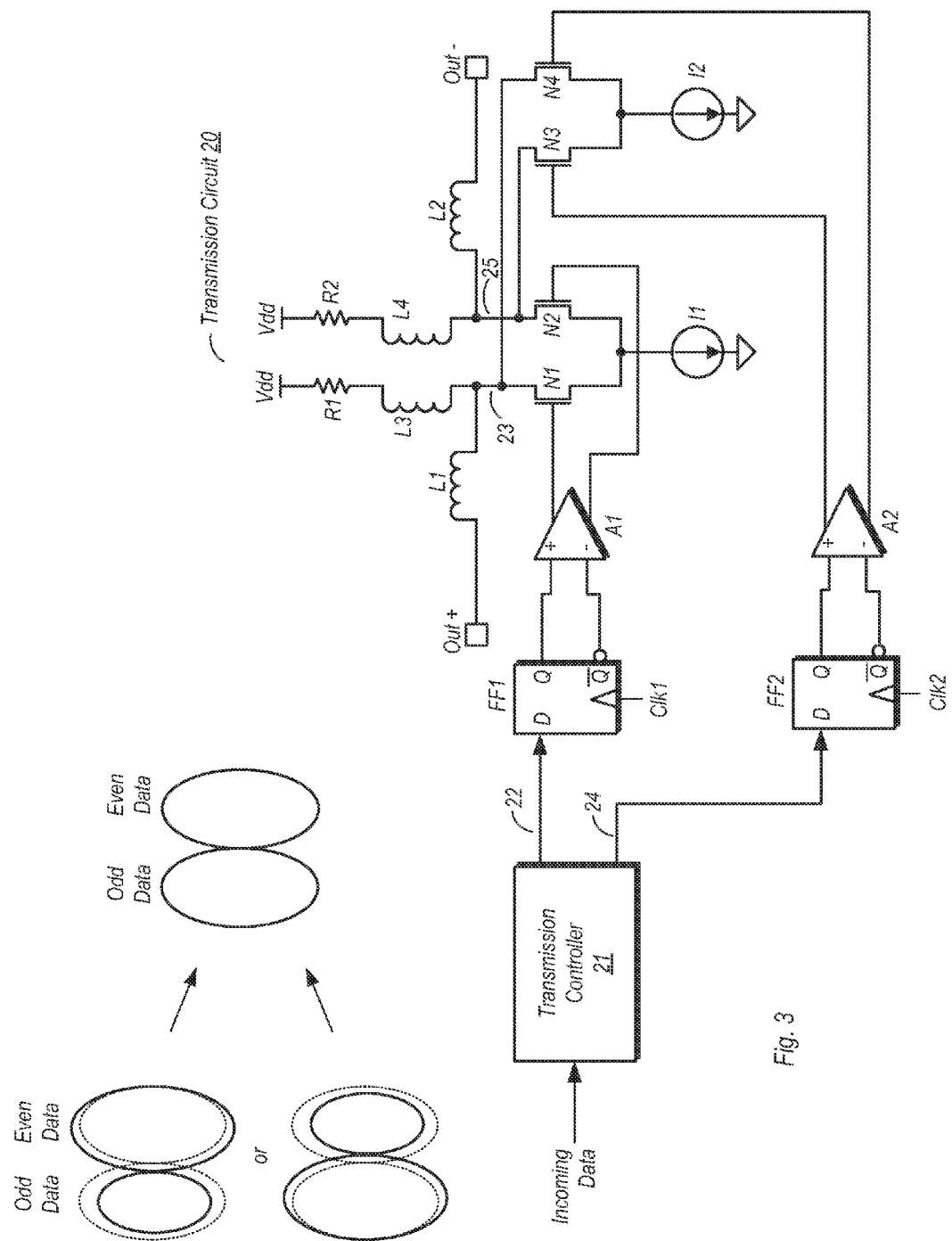
FIG. 3 is a diagram illustrating one embodiment of a transmission circuit including a transmission controller and multiple drivers.

Turning now to FIG. 3, a schematic diagram of one embodiment of a transmission circuit 20 configured to compensate for duty cycle distortion is illustrated. In the embodiment shown, transmission circuit 20 is configured to compensate for duty cycle distortion that may cause the odd data to be smaller in amplitude and width than the even data, or vice versa. The compensation circuit may readjust the respective amplitudes and widths of the odd and even data so that they are substantially the same. As used herein, the term "substantially the same" when referring to the parameters of the odd and even data may be defined that the differences therebetween are negligible and do not adversely affect a receiver's ability to properly interpret their respective data values.

Transmission circuit 20 includes a transmission controller 21 that is coupled to receive the incoming data. In some embodiments, the data may be received in parallel transmissions, and thus transmission controller 21 may serialize the data. In other embodiments, data may be received serially by transmission controller 21. After receiving the data, serializing it (if required), and arranging into pairs of odd and even data bits, transmission controller may transmit corresponding bits into a main data path and a compensation data path. In this embodiment, bits corresponding to the odd data bit may be transmitted into the main and compensation data paths, followed by the transmission of bits corresponding to the even data bit. As will be explained in further detail below, the bits transmitted for a given one of the odd and even data may be logically equivalent, or may be logically complementary, depending on the relative sizes of the odd and even eyes.

As used herein, the term "eye" when used in conjunction with the odd or even data bits may refer to the width (in time) and amplitude of their corresponding signals, as would be displayed in an eye diagram on an oscilloscope. More generally, the 'eye' may be defined herein as being the amplitude and width (in time) as applied to the designated one of the odd or even data bits. Accordingly, the statement that "the odd eye is larger than the even eye" may be interpreted as stating that the signal amplitude and width of an odd data bit for a given odd/even pair is greater than the signal amplitude and width for the even data bit of the same pair.

Bits transmitted into the main data path may be output via signal line 22. Bits transmitted into the compensation data path may be output via signal line 24. For each bit, odd and even, corresponding data bits are transmitted into each of the main and compensation data paths. Transmission controller 21 also performs additional functions to effectuate operation to compensate for duty cycle distortion by transmission circuit 20.

In the main data path, data is received by a first flip-flop, FF1, which effectively re-times the data. In the second data path, data is received by a second flip-flop, FF2, which also re-times the received data. FF1 outputs true and complementary states (via the Q and Q-bar outputs) of its respectively received data to a first differential amplifier, A1. Similarly, FF2 outputs true and complementary states of its respectively received data to a second differential amplifier, A2.

In the embodiment shown, transmission circuit 20 includes two current mode logic (CML) drivers. A first of these CML drivers includes transistors N1 and N2, along with current source I1. The gate terminal of transistor N1 is coupled to the positive output of differential amplifier A1, while the gate terminal of N2 is coupled to the negative output of A1. A second CML driver includes transistors N3 and N4, along with current source I2. The gate terminal of transistor N1 is coupled to the positive output of A2, while the gate terminal of N4 is coupled to the negative terminal of A2. Both of the CML drivers are coupled to a common differential output comprising node 23 (coupled to the respective drain terminals of N1 and N3) and node 25 (coupled to the respective drain terminals of N2 and N4). The final output of transmission circuit is driven on nodes Out+ (coupled to node 23 via inductor L1) and Out− (coupled to node 25 via inductor L2). Nodes 23 and 25 are each coupled to respective resistive-inductive (RL) networks. A first RL network includes resistor R1 and inductor L3, wherein R1 is coupled between Vdd and L3, while L3 is coupled between R1 and node 23. A second RL network includes resistor R2 and inductor L4, with R2 being coupled between Vdd and L4, while L4 is coupled between R2 and node 25.

Although not explicitly shown, transmission controller 21 is coupled to receive the clock signals Clk1 and Clk2. Using the clock signals, the transmission controller may determine if the odd eye is smaller than the even eye, if the even eye is smaller than the odd eye, or whether the odd eye is substantially equal to the even eye.

Transmission controller 21 may transmit data bits into the main and compensation data paths based on the relative eye sizes of the odd and even data. An algorithm implemented by one embodiment of transmission controller 21 is as follows:

Case: DCD compensation mode:
if (odd eye is small) {
DCD_odd_data=Odd main data
DCD_even_data=inv (Eve main data)
} else if (even eye is small) {
DCD_odd_data=Inv(Odd main data)
DCD_even_data=Even main data
} else {odd/even_data=odd/even main data).

In the above, main data (e.g., 'Odd main data') refers to data bits transmitted into main data path by transmission controller 21. The data indicated as 'DCD' data (e.g, 'DCD_odd_data') refers to data transmitted into the compensation data path by transmission controller 21. 'Inv' as used above indicates that the designated value of that bit is a complement of its true data value. For example, the statement:

DCD_odd_data=Inv(Odd main data)
indicates that the bit corresponding to the odd data that transmitted into the compensation data path is the logical inverse, or complement, of the bit corresponding to the odd data that is transmitted into the main data path.

When the odd eye is smaller (e.g., the clocks are misaligned such that the amplitude and width of the odd data will be smaller than the even data if no compensation is performed), then transmission controller 21 may transmit data corresponding to the odd data bit into the main and compensation data paths at logically equivalent values. For example, if data corresponding to the odd data bit is transmitted into the main data path as a logic 1, the data transmitted into the compensation data path that also corresponds to the odd data bit is also transmitted as a logic 1. However, in the case of the odd eye being smaller, the data corresponding to the even data bit is transmitted into the compensation data path is a logical complement of the data corresponding to the even data bit that is transmitted into the main data path. For example, in the case of the odd eye being smaller than the even eye, the even main data may have a value of a logic 1, while the DCD even data may have a value of logic 0.

In the case when the even eye is smaller than the odd eye, the even main data and DCD even data are transmitted into the main and compensation data paths, respectively, at logically equivalent values. Odd main data and DCD odd data are transmitted in the main and compensation data paths, respectively, at logically complementary data values in the case when the even eye is smaller than the odd eye.

In the case where the even and odd eyes are determined by transmission controller to have substantially the same size, the main and DCD data for both the odd and even data bits are transmitted as logically equivalent values. In this case, compensation is not performed.

Compensation in transmission circuit 20 may be realized by summing the electrical responses of data sent into the main and compensation data paths on nodes 23 and 25. In the case when the odd eye is smaller than the even eye, transmitting even main data and DCD even data as logical complements of one another may have the effect of reducing the differential amplitude of the even data bit as collectively seen on nodes 23 and 25. This in turn also results in a reduction of the width of the even data bit while increasing the amplitude of the odd data bit (resulting in a corresponding increase in its width). In the case when the even eye is smaller than the odd eye, even main data and DCD even data are transmitted as logically equivalent values, while odd main data and DCD odd data are transmitted as logical complements to one another. This results in a reduction of amplitude and width of the odd data bit and a corresponding increase in the amplitude and width of the even data bit, as collectively seen at nodes 23 and 25.

In general, transmitting bits into the main and compensation data path as logically complementary values, wherein those bits correspond to one of the odd or even data bits, results in a reduction of amplitude and width of the corresponding one of the odd or even data bits when seen as a differential signal on nodes 23 and 25, due to the summing of the signals on those nodes. The reduction of amplitude and width of one of the odd and even bits, as seen on as a differential signal on nodes 23 and 25, may in turn result in a corresponding increase in amplitude and width of the other one of the odd and even data bits.

Figure 4:
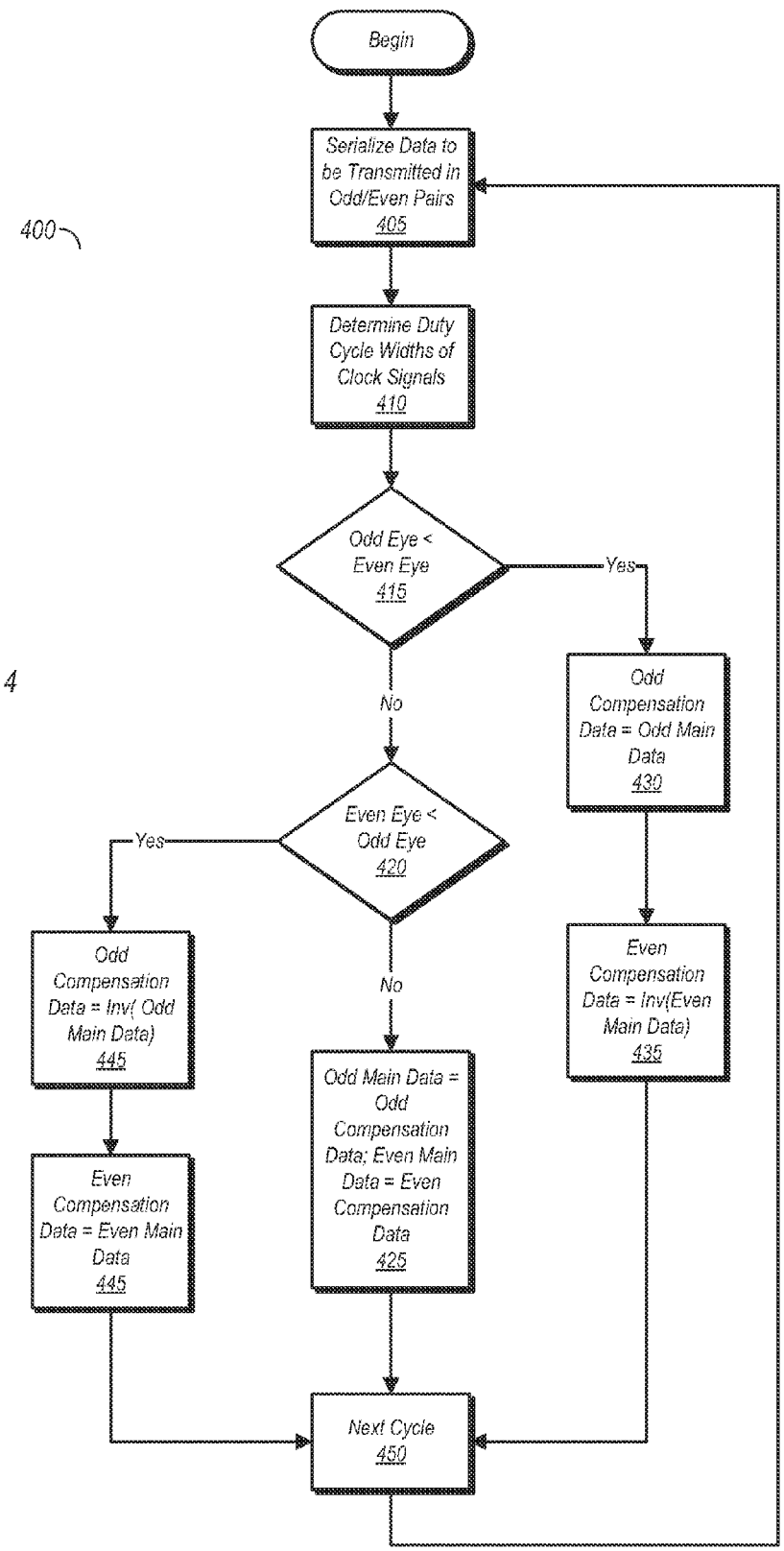
FIG. 4 is a flow diagram of one embodiment of a method for compensating for duty cycle distortion.

Turning now to FIG. 4, a flow diagram illustrating one embodiment of a method for performing compensation for duty cycle distortion is shown. Method 400 as discussed herein may be performed by the circuit embodiment shown in FIG. 3. However, method 400 is not limited to the circuit embodiment illustrated in FIG. 3. Moreover, other circuit embodiments capable of carrying out the method illustrated by the flow diagram of FIG. 4 are possible and contemplated. For example, one embodiment of a circuit including an additional CML driver circuit coupled to receive FIR (finite impulse response) data from a transmission controller is possible and contemplated.

Method 400 begins with the serialization of data to be transmitted into odd and even pairs (block 400). Method 400 further includes the determination of the relative duty cycle widths based on the clock signals (block 410). In one embodiment, the alignment of the clock signals may be determined, thereby allowing a determination to be made as to the sizes of the odd and even eyes with respect to one another.

If the odd eye is determined to be smaller than the even eye (block 415, yes), then bits corresponding to the odd data are transmitted into the main and compensation data paths as logically equivalent values (block 430). Thereafter, bits corresponding to the even data are transmitted into the main and compensation data paths as complementary values with respect to each other (block 435). The method then proceeds to the next cycle (block 450), returning to block 405.

If the odd eye is not determined to be smaller than the even eye (block 415, no), but instead the even eye is determined to be smaller than the odd eye (block 420, yes), then bits corresponding to the odd data are transmitted into the main and compensation data paths as logical complements of one another (block 440). Thereafter, bits corresponding to the even data are transmitted into the main and compensation data paths as logically equivalent values (block 445). The method then proceeds to the next cycle (block 450) and returns to block 405.

If the odd eye is not smaller than the even eye (block 415, no) and the even eye is not smaller than the odd eye (block 420, no), then the odd and even eyes are substantially equal. It is noted that in this case, the odd and even eyes may not be exactly the same size, but rather that any differences between the two is negligible and is not likely to cause a misinterpretation of the data by a receiver. In this case, bits corresponding to the odd data are transmitted into the main and compensation data paths as logically equivalent values, followed by the transmission of bits corresponding to the even data into the main and compensation data paths at logically equivalent values. Moreover, when the odd and even eyes are determined to be substantially equal, no compensation is performed since no significant duty cycle distortion exists. Thereafter, the method proceeds to the next cycle (block 450), returning to block 405.

Numerous variations and modifications will become apparent to those skilled in the art once the above disclosure is fully appreciated. It is intended that the following claims be interpreted to embrace all such variations and modifications.

What is claimed is:

1. A system comprising:
   a transmission unit coupled to receive data and configured to serially transmit the data in sequentially transmitted pairs of bits including bits corresponding a first bit received by the transmission unit followed by bits corresponding to a second bit received by the transmission unit, wherein the transmission unit is configured to determine respective duty cycle widths for each of the first and second bits;
   a main data path coupled to the transmission unit; and
   a compensation data path coupled to the transmission unit, wherein the main path includes a first driver circuit, and wherein the compensation path includes a second driver circuit, and wherein the system further comprises a differential data path coupled to output terminals of the first and second driver circuits;
   wherein the transmission unit is configured to transmit third and fourth bits into the main and compensation paths, respectively, the third and fourth bits corresponding to the first bit, wherein the fourth bit is transmitted as a complement of the third bit if the duty cycle width of the first bit is greater than the duty cycle width of the second bit; and
   wherein the transmission unit is further configured to transmit fifth and sixth bits into the main and compensation paths, respectively, the fifth and sixth bits corresponding to the second bit, wherein sixth bit is transmitted as a complement of the fifth bit if the duty cycle width of the second bit is greater than the duty cycle width of the first bit.

2. The system as recited in claim 1, wherein the first and second driver circuits are configured to transmit the first bit responsive to transmission of the third and fourth bits, and further configured to transmit the second bit, subsequent to transmission of the first bit, responsive to transmission of the fifth and sixth bits.

3. The system as recited in claim 1, wherein the main path further includes a first differential amplifier coupled to provide the third and fifth bits to the first driver circuit, and wherein the compensation path includes a second differential amplifier coupled to provide the fourth and sixth bits to the second driver circuit.

4. The system as recited in claim 3, wherein the main path includes a first flip-flop circuit coupled to provide true and complementary data for the third and fifth bits to the first differential amplifier, and wherein the compensation path includes a second flip-flop coupled to provide true and complementary data for the fourth and sixth bits to the second differential amplifier.

5. The system as recited in claim 4, wherein the first flip-flop is coupled to receive, in succession, the third and fifth bits from the transmission unit, and wherein the second flip-flop is coupled to receive, in succession, the fourth and sixth bits from the transmission unit.

6. The system as recited in claim 1, wherein the transmission unit is configured to transmit the third and fourth bits as logically equivalent values if the duty cycle width of the first bit is less than the duty cycle width of the second bit or substantially equal to the duty cycle width of the second bit.

7. The system as recited in claim 1, wherein the transmission unit is configured to transmit the fifth and sixth bits as logically equivalent values if the duty cycle width of the second bit is less than the duty cycle width of the first bit or substantially equal to the duty cycle width of the first bit.

8. A method comprising:
   receiving first and second bits of data to be transmitted as differential data over a communications link, wherein the differential data is serially transmitted in pairs of bits including the first bit followed by the second bit;
   determining respective duty cycle widths for each of the first and second bits as received;
   transmitting third and fourth bits into main and compensation paths, respectively, the third and fourth bits corresponding to the first bit, wherein the fourth bit is transmitted as a complement of the third bit if the duty cycle width of the first bit is greater than the duty cycle width of the second bit;
   transmitting the first bit from first and second driver circuits responsive to a transmission controller transmitting the third and fourth bits;
   transmitting fifth and sixth bits into the main and compensation paths, respectively, the fifth and sixth bits corresponding to the second bit, wherein sixth bit is transmitted as a complement of the fifth bit if the duty cycle width of the second bit is greater than the duty cycle width of the first bit; and
   transmitting the second bit from the first and second driver circuits, subsequent to transmitting the first bit, responsive to the transmission controller transmitting the fifth and sixth bits.

9. The method as recited in claim 8, further comprising transmitting the third and fourth bits at logic values equivalent to one another if the duty cycle width of the first bit is less than the duty cycle width of the second bit or substantially equal to the duty cycle width of the first bit.

10. The method as recited in claim 8, further comprising transmitting the fifth and sixth bits at logic values equivalent to one another if the duty cycle width of the second bit is less than the duty cycle width of the first bit or substantially equal to the duty cycle width of the first bit.

11. The method as recited in claim 8, further comprising:
    driving, from a first differential amplifier, the third and fifth bits, sequentially, to the first driver circuit; and
    driving, from a second differential amplifier, the fourth and sixth bits, sequentially, to the second driver circuit.

12. The method as recited in claim 11, further comprising:
    a first flip-flop providing true and complementary values for each of the third and fifth bits to the first differential amplifier; and
    a second flip-flop providing true and complementary values for each of the fourth and providing complementary values for each of the fifth and sixth bits to the second differential amplifier.

13. The method as recited in claim 12, further comprising:
    receiving at the first flip-flop, in succession, the third and fifth bits from a transmission unit; and
    receiving at the second flip-flop, in succession, the fourth and sixth bits from the transmission unit.

14. The method as recited in claim 13, further comprising:
    receiving, at the transmission unit, the data to be transmitted as differential data over the communications link; and
    generating the third, fourth, fifth, and sixth bits responsive to receiving the data for each pair of bits comprising the first bit and the second bit.

15. An integrated circuit comprising:
    a differential signal transmitter having a main data path and a compensation data path, wherein the main data path includes a first differential driver circuit having output terminals coupled to a differential output, and wherein the compensation data path includes a second differential driver circuit having output terminals coupled to the differential output; and a transmission controller configured to transmit data into the main and compensation data paths, the data corresponding to pairs of sequentially transmitted bits including an odd data bit followed by an even data bit, and wherein the transmission controller is further configured to determine respective duty cycle widths for each of the odd and even data bits as received by the transmission controller, and further configured to cause the first and second driver circuits to equalize the respective duty cycle widths of the odd and even data bits, as transmitted by the driver circuits, based on the determination of the respective duty cycle widths of the odd and even data bits as received, wherein the transmission controller is configured to sequentially transmit first and second data bits into the main data path, the first and second data bits corresponding to the odd and even data bits, respectively, and sequentially transmit third and fourth data bits into the compensation data path, the third and fourth data bits corresponding to the odd and even data bits, respectively.

16. The integrated circuit as recited in claim 15, wherein the transmission controller is configured to:

transmit the third data bit as a logical complement of the first data bit responsive to determining that the duty cycle width of the even data bit is smaller than the duty cycle width of the odd data bit; and transmit the fourth data bit as a logical complement of the second data bit responsive to determining that the duty cycle width of the odd data bit is smaller than the duty cycle width of the even data bit.

17. The integrated circuit as recited in claim 16, wherein the transmission controller is further configured to:

transmit the third data bit at a value that is logically equivalent to the first data bit responsive to determining that the odd data bit has a duty cycle that is greater than or substantially equal to the duty cycle of the even data bit;

transmit the fourth data bit at a value that is logically equivalent to the second data bit responsive to determining that the even data bit has a duty cycle that is greater than or substantially equal to the duty cycle of the odd data bit.

* * * * *

UNITED STATES PATENT AND TRADEMARK OFFICE
CERTIFICATE OF CORRECTION

| | |
|---|---|
| PATENT NO. | : 8,994,427 B2 |
| APPLICATION NO. | : 13/937424 |
| DATED | : March 31, 2015 |
| INVENTOR(S) | : Qin et al. |

It is certified that error appears in the above-identified patent and that said Letters Patent is hereby corrected as shown below:

In the specification

Column 5, line 6, delete "(Eve main data)" and insert -- (Even main data) --, therefor.

Signed and Sealed this
Third Day of November, 2015

Michelle K. Lee
*Director of the United States Patent and Trademark Office*